(12) United States Patent
Botvinnik et al.

(10) Patent No.: US 7,546,176 B2
(45) Date of Patent: Jun. 9, 2009

(54) METHOD AND APPARATUS FOR DETERMINING A SOLUTION GROUP OF PARTS IN AN ASSEMBLY

(75) Inventors: Alex V. Botvinnik, Glenview, IL (US); Michael R. Holle, Kent, WA (US); Deborah L. Hartley, Bellevue, WA (US)

(73) Assignee: The Boeing Company, Chicago, IL (US)

( * ) Notice: Subject to any disclaimer, the term of this patent is extended or adjusted under 35 U.S.C. 154(b) by 0 days.

(21) Appl. No.: 11/844,905

(22) Filed: Aug. 24, 2007

(65) Prior Publication Data

US 2008/0052046 A1    Feb. 28, 2008

Related U.S. Application Data

(63) Continuation-in-part of application No. 11/523,196, filed on Sep. 18, 2006, now Pat. No. 7,519,445.

(60) Provisional application No. 60/840,221, filed on Aug. 25, 2006.

(51) Int. Cl.
| | |
|---|---|
| *G06F 19/00* | (2006.01) |
| *G06F 17/50* | (2006.01) |
| *B64D 47/00* | (2006.01) |
| *G06T 15/00* | (2006.01) |
| *G09G 5/02* | (2006.01) |
| *G09G 5/00* | (2006.01) |
| *G09B 25/00* | (2006.01) |

(52) U.S. Cl. .............. 700/106; 244/1 R; 345/419; 345/594; 345/606; 345/619; 345/629; 345/679; 434/372; 434/379; 703/1

(58) Field of Classification Search .............. 700/106; 703/1; 434/372, 379; 345/419, 594, 606, 345/619, 629, 679; 244/1 R
See application file for complete search history.

(56) References Cited

U.S. PATENT DOCUMENTS

| | | | | | |
|---|---|---|---|---|---|
| 3,874,620 | A | * | 4/1975 | Kahler et al. | 244/110 B |
| 5,165,269 | A | * | 11/1992 | Nguyen | 73/1.76 |
| 6,980,934 | B1 | * | 12/2005 | Sadovnik | 703/1 |
| 7,318,001 | B2 | * | 1/2008 | Clark | 702/94 |
| 2005/0230516 | A1 | * | 10/2005 | Carver et al. | 244/1 R |
| 2006/0212821 | A1 | * | 9/2006 | Charles et al. | 715/764 |
| 2006/0227130 | A1 | * | 10/2006 | Elchuri | 345/419 |

* cited by examiner

*Primary Examiner*—Crystal J Barnes Bullock
*Assistant Examiner*—Thomas H Stevens
(74) *Attorney, Agent, or Firm*—Armstrong Teasdale LLP

(57) ABSTRACT

A method of forming an assembly from a plurality of components, the plurality of components each having a component volume and a respective locus point, is described. The method includes selecting a target volume by defining a target volume and respective locus point. The method further includes determining a solution group of components comprising a list of components having a component volume positioned at least one of within the target volume and a predetermined distance from the target volume. The method further includes displaying the solution group of components forming an assembly.

20 Claims, 10 Drawing Sheets

METHOD AND APPARATUS FOR DETERMINING A SOLUTION GROUP OF PARTS IN AN ASSEMBLY

CROSS REFERENCE TO RELATED APPLICATIONS

This application is a continuation-in-part of U.S. patent application Ser. No. 11/523,196, filed Sep. 18, 2006, now U.S. Pat. No. 7,519,445 which claims the benefit of prior filed copending Provisional Patent Application Ser. No. 60/840,221, filed Aug. 25, 2006, both of which are hereby incorporated by reference.

BACKGROUND OF THE INVENTION

The present invention is directed to systems effecting virtual representation of complex assemblies, and especially to identifying particular parts in an assembly represented by such a system.

There are existing software programs that identify individual parts, also referred to herein as components, within an assembly in an on-line format amenable to manipulation. The prior art programs of this type are substantially focused upon a manufacturing environment, permitting substantially automatic generation of materials lists required for producing an assembly. Other related reports and lists may be produced using such programs as well.

However, the manufacturing process intended application of such prior art on-line systems and apparatuses results in a user having to access the entire system to identify a small solution group of parts within the assembly. By way of example and not by way of limitation, in the case of an on-line manufacturing system and apparatus appropriate for assembly or manufacturing of an aircraft, a user desiring to identify a solution group of parts bounding an identified group of parts must load the entire parts catalog of the system encompassing the entire aircraft in order to conduct a search for the solution group. Further, because of the manufacturing-related nature of the system and apparatus, the user likely needs to also know the process flow and the layout of the finished assembly in order to effect the exemplary desired search. In the case of a large complex commercial aircraft, it is burdensome to load the on-line descriptions for an entire parts inventory on most computers available for such an inquiry due to the file size of the on-line descriptions. Often, the search must therefore be conducted by loading the parts inventory descriptions in sections. This is a cumbersome process that occupies computing assets and may interfere with other processes for which the computing assets may be required.

BRIEF DESCRIPTION OF THE INVENTION

In one embodiment, a method of forming an assembly from a plurality of components, the plurality of components each having a component volume and a respective locus point, is provided. The method includes selecting a target volume by defining a target volume and respective locus point. The method further includes determining a solution group of components comprising a list of components having a component volume positioned at least one of within the target volume and a predetermined distance from the target volume. The method further includes displaying the solution group of components forming an assembly.

In another embodiment, a system for forming an assembly by identifying a solution group of components from a plurality of components is provided. The system includes a storage unit configured to store data identifying a component volume and related locus point for each of the plurality of components. The system also includes an input unit that facilitates the selection of a target volume defined by a locus point and a volume. The system also includes a computing unit communicatively coupled to the storage unit and the input unit, the computing unit configured to identify a solution group of components, the solution group of components comprising components having a component volume positioned at least one of within the target volume and a predetermined distance from the target volume. The system also includes an output unit communicatively coupled to the computing unit and configured to display the solution group.

In yet another embodiment, a method of identifying a component content of a relevant portion of an assembly is provided. The method comprises selecting a target volume representing the relevant portion of the assembly by defining a target volume and respective locus point, determining the component content of the relevant portion of the assembly comprising a list of components having a component volume positioned at least one of within the target volume and a predetermined distance from the target volume, and displaying the component content of the relevant portion of the assembly.

DETAILED DESCRIPTION OF THE INVENTION

Figure 1:
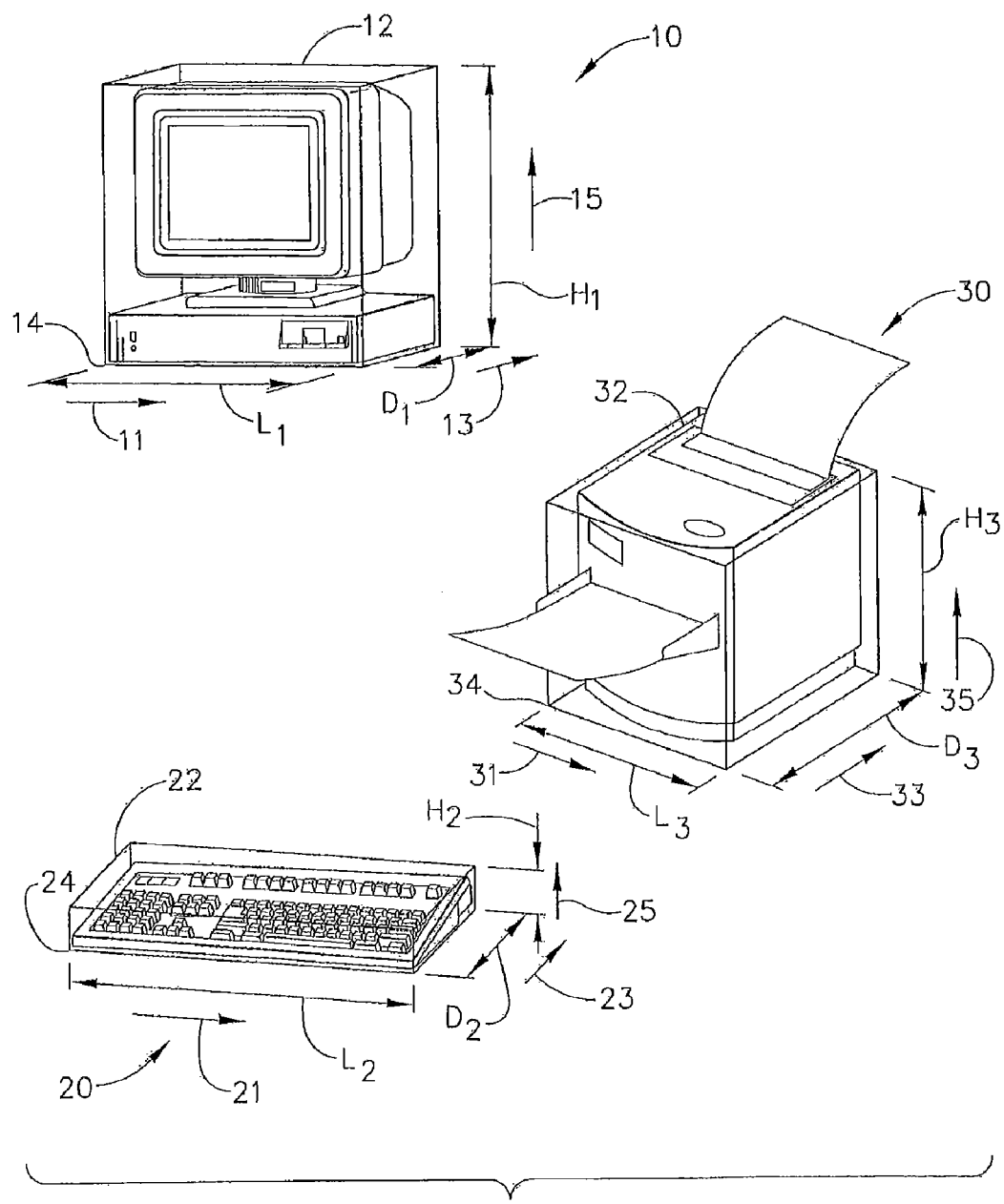
FIG. 1 presents perspective drawings of exemplary individual parts having representative polyhedral part-containing volumes.

FIG. 1 presents perspective drawings of exemplary individual parts having representative polyhedral part-containing volumes. In FIG. 1, a processing unit 10 is illustrated with an associated part-containing volume 12. Part-containing volume 12 substantially contains processing unit 10. Part-containing volume 12 extends from a reference locus 14 in a first direction 11 for a length $L_1$, extends in a second direction 13 substantially perpendicular with direction 11 for a depth $D_1$, and extends in a third direction 15 substantially perpendicular with directions 11, 13 for a height $H_1$.

An input unit 20 is illustrated with an associated part-containing volume 22. Part-containing volume 22 substantially contains input unit 20. Part-containing volume 22 extends from a reference locus 24 in a first direction 21 for a length $L_2$, extends in a second direction 23 substantially perpendicular with direction 21 for a depth $D_2$, and extends in a third direction 25 substantially perpendicular with directions 21, 23 for a height $H_2$.

A printing unit 30 is illustrated with an associated part-containing volume 32. Part-containing volume 32 substantially contains printing unit 30. Part-containing volume 32 extends from a reference locus 34 in a first direction 31 for a length $L_3$, extends in a second direction 33 substantially perpendicular with direction 31 for a depth $D_3$, and extends in a third direction 35 substantially perpendicular with directions 31, 33 for a height $H_3$. As illustrated in FIG. 1, direction 31 is not necessarily parallel with directions 11, 21, direction 33 is not necessarily parallel with directions 13, 23 and direction 35 is not necessarily parallel with directions 15, 25.

Figure 2:
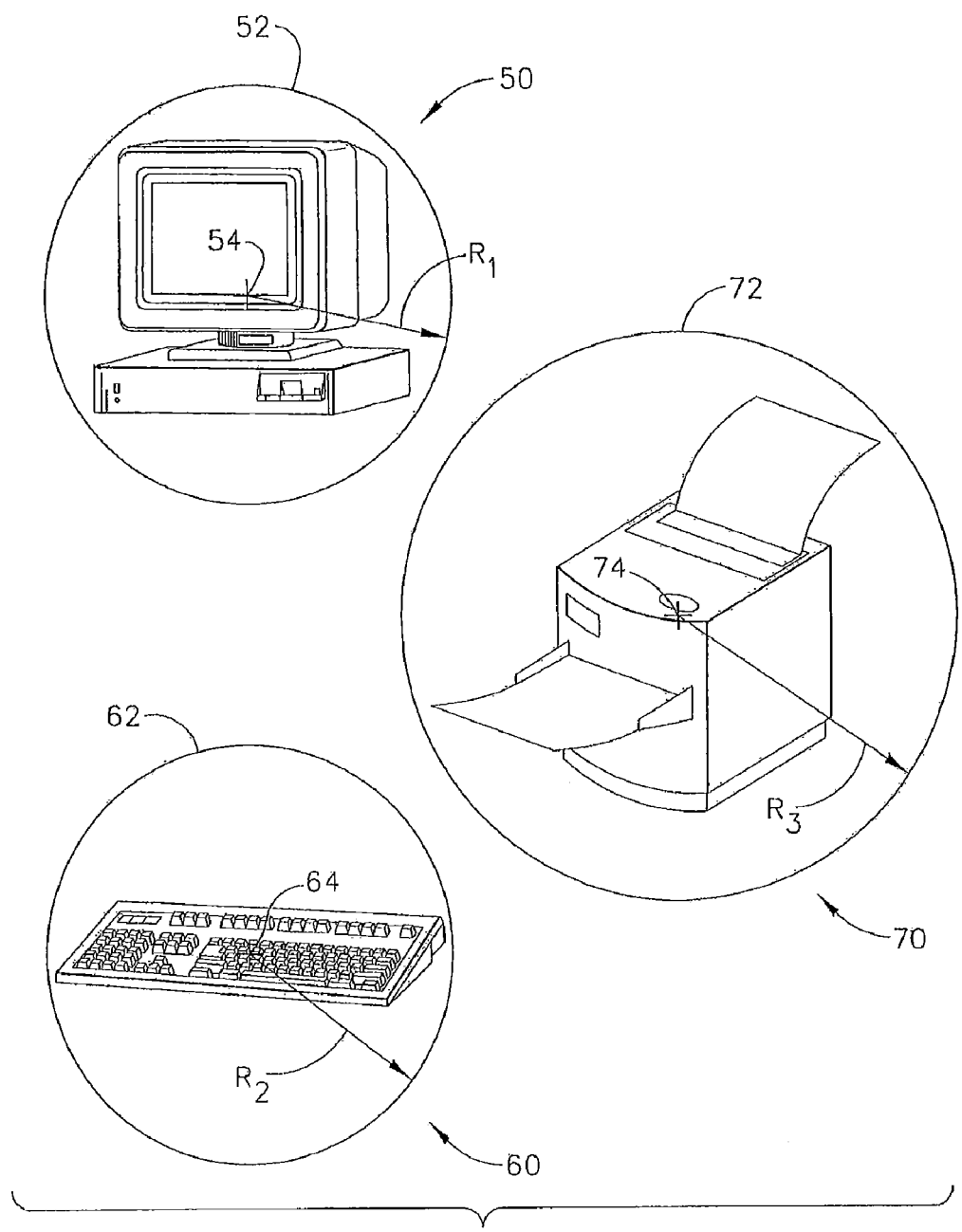
FIG. 2 presents perspective drawings of exemplary individual parts having representative spherical part-containing volumes.

FIG. 2 presents perspective drawings of exemplary individual parts having representative spherical part-containing volumes. In FIG. 2, a processing unit 50 is illustrated with an associated part-containing volume 52. Part-containing volume 52 substantially contains processing unit 50. Part-containing volume 52 is substantially spherical in shape, centered at a center locus 54 and having a radius $R_1$.

An input unit 60 is illustrated with an associated part-containing volume 62. Part-containing volume 62 substantially contains input unit 60. Part-containing volume 62 is substantially spherical in shape, centered at a center locus 64 and having a radius $R_2$.

A printing unit 70 is illustrated with an associated part-containing volume 72. Part-containing volume 72 substantially contains printing unit 70. Part-containing volume 72 is substantially spherical in shape, centered at a center locus 74 and having a radius $R_3$.

Figure 3:
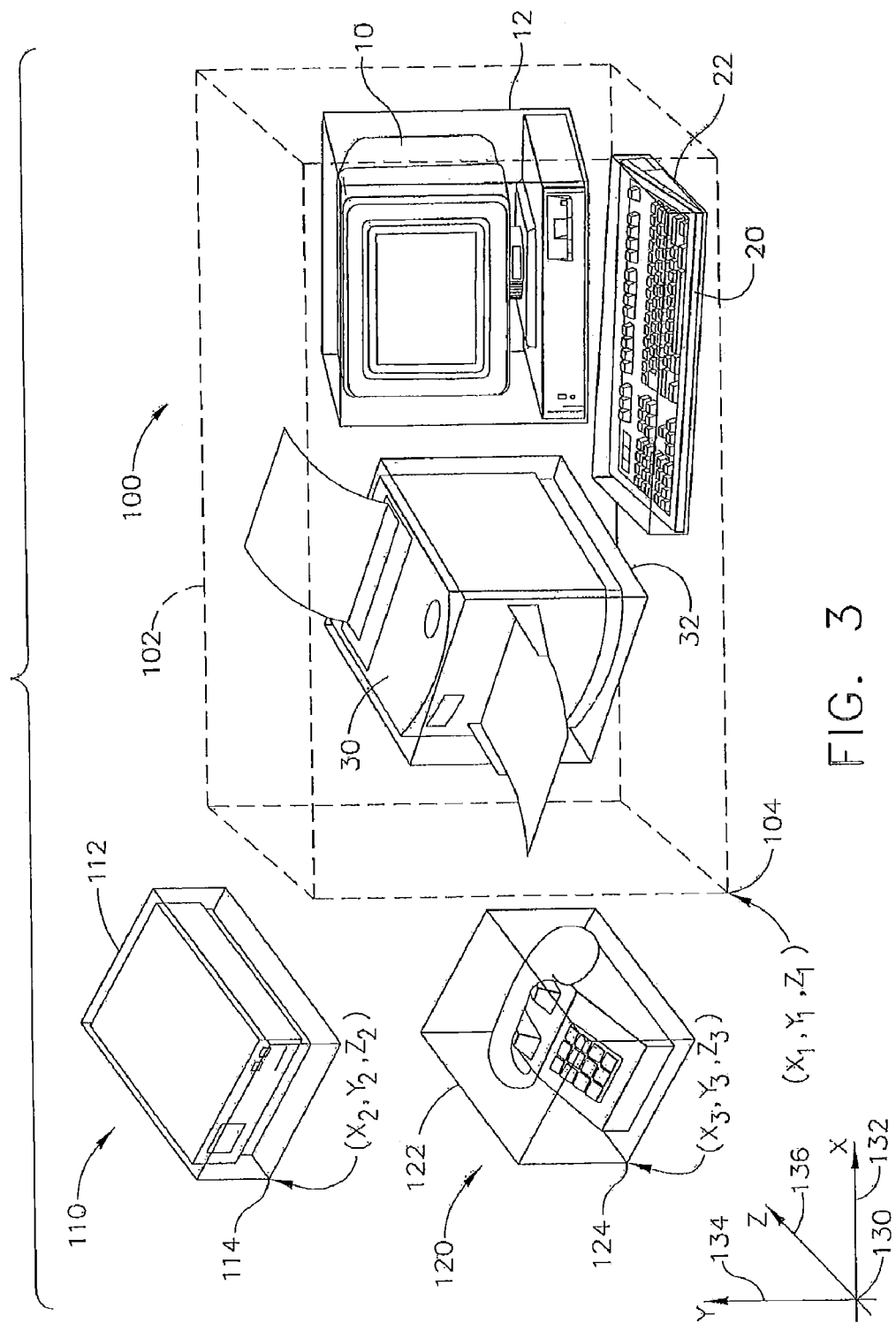
FIG. 3 illustrates a representative assembly including a polyhedral target volume containing the exemplary parts illustrated in FIG. 1 and associated proximate additional parts.

FIG. 3 illustrates a representative assembly including a polyhedral target volume containing the exemplary parts illustrated in FIG. 1 and associated proximate additional parts. In FIG. 3, a processing assembly 100 includes a processing unit 10, an input unit 20 and a printing unit 30. Processing unit 10 is contained in a part-containing volume 12 substantially containing processing unit 10. Input unit 20 is contained in a part-containing volume 22 substantially containing input unit 20. Printing unit 30 is contained in a part-containing volume 32 substantially containing printing unit 30.

Processing assembly 100 is substantially contained within a target volume 102. Target volume 102 substantially contains part-containing volumes 12, 22, 32. Target volume 102 is located with respect to an origin 130 and three axes; X-axis 132, Y-axis, 134 and Z-axis 136. Axes 132, 134, 136 are substantially orthogonal and intersect substantially at axis 130. Target volume 102 has a reference locus 104 located substantially at a point defined by measurements along axes 132, 134, 136: $(X_1, Y_1, Z_1)$.

A modem unit 110 substantially contained within a part-containing volume 112 is situated near or proximate to target volume 102. Part-containing volume 112 has a reference locus 114 located substantially at a point defined by measurements along axes 132, 134, 136: $(X_2, Y_2, Z_2)$. A telephone unit 120 substantially contained within a part-containing volume 122 is also situated near or proximate to target volume 102. Part-containing volume 122 has a reference locus 124 located substantially at a point defined by measurements along axes 132, 134, 136, and represented by Cartesian coordinates, for example, $(X_3, Y_3, Z_3)$.

In one embodiment a target volume 102 is ascertained. If either of part-containing volumes 112, 122 has a predetermined relationship with target volume 102, the respective such related part 110, 120 is designated as a relevant part and is identified by the present invention as part of a solution group for a user. By way of example and not by way of limitation, the solution group may be sought by a user for use in a repair manual or in a service bulletin. By way of example and not by way of limitation, a predetermined relationship may be that one or both of part-containing volumes 112, 122 abuts or intersects target volume 102.

Figure 4:
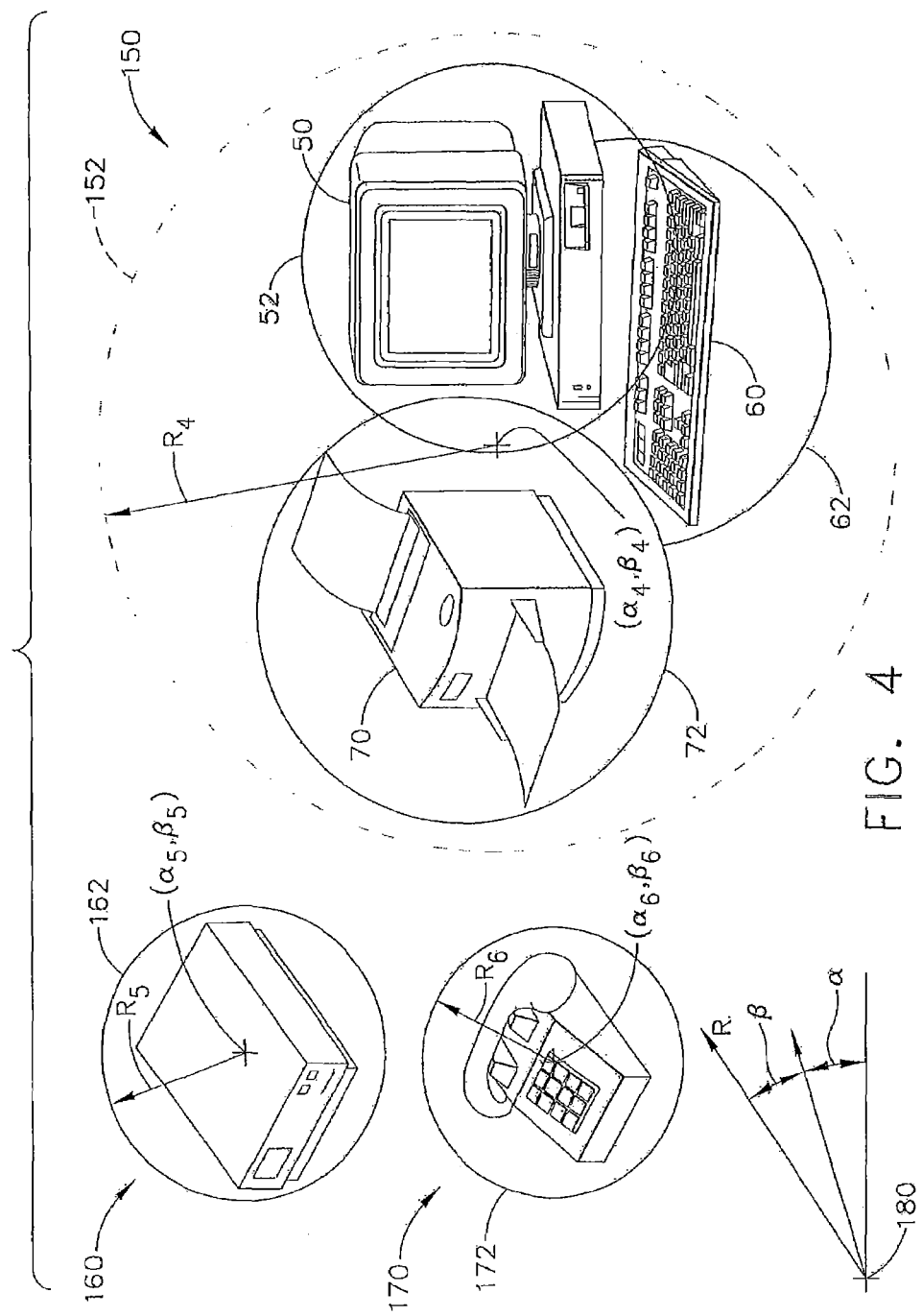
FIG. 4 illustrates a representative assembly including a polyhedral target volume containing the exemplary parts illustrated in FIG. 2 and associated proximate additional parts.

FIG. 4 illustrates a representative assembly including a polyhedral target volume containing the exemplary parts illustrated in FIG. 2 and associated proximate additional parts. In FIG. 4, a processing assembly 150 includes a processing unit 50, an input unit 60 and a printing unit 70. Processing unit 50 is contained in a part-containing volume 52 substantially containing processing unit 50. Input unit 60 is contained in a part-containing volume 62 substantially containing input unit 60. Printing unit 70 is contained in a part-containing volume 72 substantially containing printing unit 70.

Processing assembly 150 is substantially contained within a target volume 152. Target volume 152 substantially contains part-containing volumes 52, 62, 72. Target volume 152 is located with respect to an origin 180 and spherical coordinates: an angle $\alpha$ measured in a first plane, an angle $\beta$ measured in a second plane substantially perpendicular with the first plane and a radius R (distance from origin 180). Target volume 152 has a center locus located substantially at a point defined by coordinates $(\alpha_4, \beta_4)$ and has a radius $R_4$. Center locus may also be defined by spherical coordinates such as $(\rho, \phi, \theta)$.

A modem unit 160 substantially contained within a part-containing volume 162 is situated near or proximate to target volume 152. Part-containing volume 162 has a center locus located substantially at a point defined by coordinates $(\alpha_5, \beta_5)$ and has a radius $R_5$. A telephone unit 170 substantially contained within a part-containing volume 172 is also situated near or proximate to target volume 152. Part-containing volume 172 has a center locus located substantially at a point defined by coordinates $(\alpha_6, \beta_6)$ and has a radius $R_6$.

In another embodiment a target volume 152 is ascertained. If either of part-containing volumes 162, 172 has a predetermined relationship with target volume 152, the respective such related part 160, 170 is designated as a relevant part and is identified by the present invention as part of a solution group for a user. By way of example and not by way of limitation, the solution group may be sought by a user for use in a repair manual or in a service bulletin. By way of example and not by way of limitation, a predetermined relationship may be that one or both of part-containing volumes 162, 172 abuts or intersects target volume 152.

Figure 5:
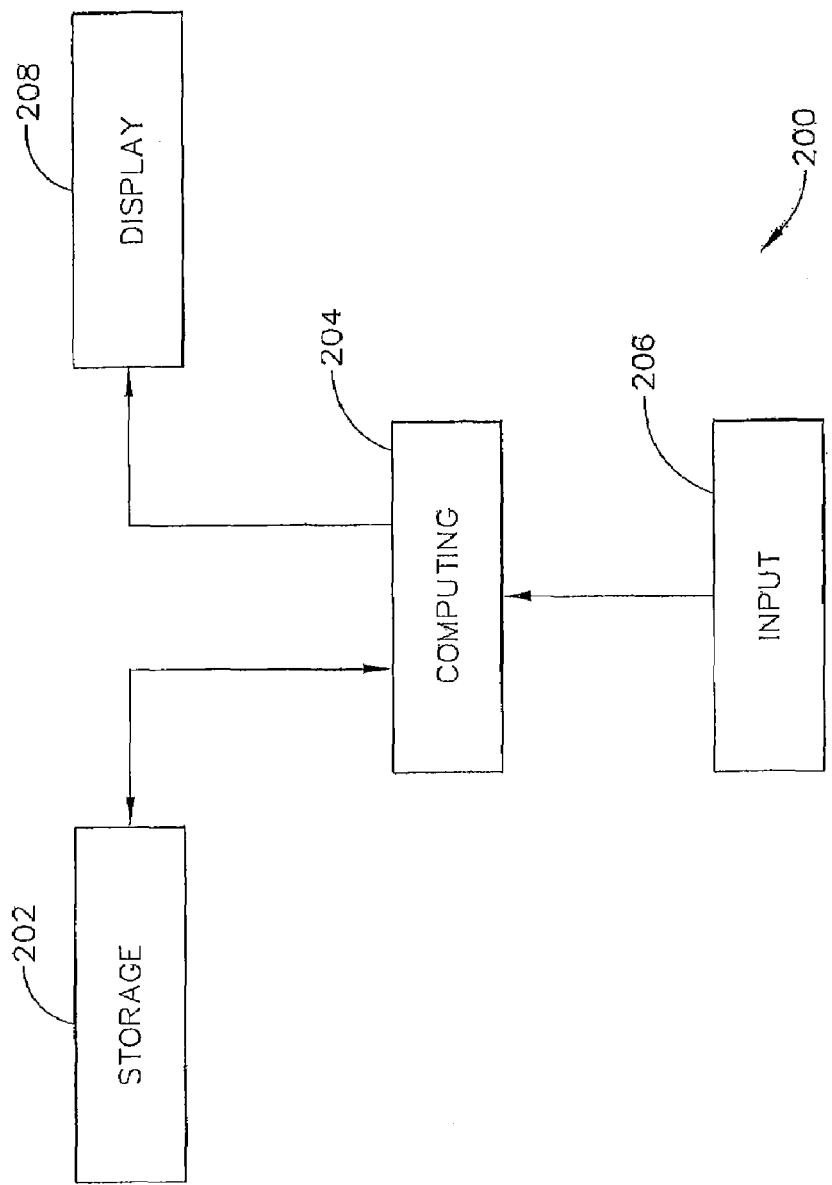
FIG. 5 is a schematic block diagram illustrating an exemplary embodiment of an apparatus for determining a solution group of parts among a plurality of parts in an assembly.

FIG. 5 is a schematic block diagram illustrating an exemplary embodiment of an apparatus 200 for determining a solution group of parts among a plurality of parts in an assembly. The solution group of parts is situated substantially proximate to at least one target part of the plurality of parts. Apparatus 200 includes a storage unit 202. Storage unit 202 stores information identifying each respective part of the plurality of parts by a respective part volume and a respective locus. Each respective part volume substantially contains at least one respective the part. Each respective locus is identified with respect to an origin. Apparatus 200 further includes a computing unit 204 coupled with storage unit 202 for accessing storage unit 202 to obtain and treat information stored in storage unit 202. As used herein, the term computing unit 204 is not limited to just those integrated circuits referred to in the art as a computer, but broadly refers to a processor, a microcontroller, a microcomputer, a programmable logic controller (PLC), an application specific integrated circuit, and other programmable circuits, and these terms are used interchangeably herein. In the exemplary embodiment, storage unit 202 may include, but is not limited to including, a computer-readable medium, such as a random access member (RAM). Alternatively, a floppy disk, a compact disc-read only memory (CD-ROM), a magneto-optical disk (MOD), and/or a digital versatile disc (DVD) may also be used.

Apparatus 200 further includes an input unit 206, for example, but not limited to, a keyboard, mouse, and/or touch screen, for commanding computing unit 204 in effecting the accessing, using and treating of information from storage unit 202. Apparatus 200 further includes an output unit 208 coupled with computing unit 204 for presenting output signals from computing unit 204. Output unit 208 may include, but is not limited to user interfaces including, a liquid crystal display (LCD), a plasma display, and/or a cathode ray tube, and allows a user to observe data received from computing unit 204.

Computing unit 204 and input unit 206 cooperate to identify a target volume substantially containing at least one target part. Computing unit 204 employs information stored in storage unit 202 to effect identifying each respective part volume for each relevant part. Each relevant part is identified by a respective part volume having a predetermined relationship with respect to the target volume. Computing unit 204 assigns each relevant part to the solution group. Output unit 208 presents the solution group to a user.

Figure 6:
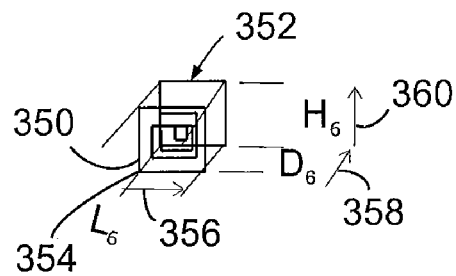
FIG. 6 presents perspective drawings of another example of individual parts having representative polyhedral part-containing volumes.
Figure 6:
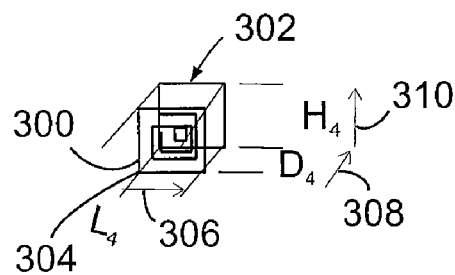
Figure 6:
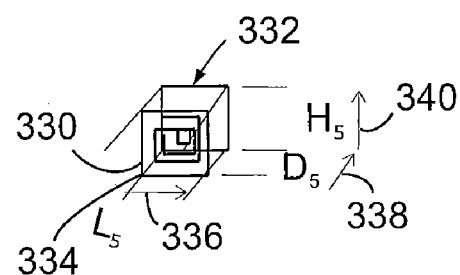

FIG. 6 presents perspective drawings of another example of individual parts having representative polyhedral part-containing volumes. In FIG. 6, a first aircraft component 300, for example, a flight control computer, is illustrated with an associated part-containing volume 302. Part-containing volume 302 substantially contains first aircraft component 300. Part-containing volume 302 extends from a reference locus 304 in a first direction 306 for a length $L_4$, extends in a second direction 308 substantially perpendicular with direction 306 for a depth $D_4$, and extends in a third direction 310 substantially perpendicular with directions 306 and 308 for a height $H_4$.

A second aircraft component 330, for example, a navigation system, is illustrated with an associated part-containing volume 332. Part-containing volume 332 substantially contains second aircraft component 330. Part-containing volume 332 extends from a reference locus 334 in a first direction 336 for a length $L_5$, extends in a second direction 338 substantially perpendicular with direction 336 for a depth $D_5$, and extends in a third direction 340 substantially perpendicular with directions 336 and 338 for a height $H_5$.

A third aircraft component 350, for example, a radar altimeter, is illustrated with an associated part-containing volume 352. Part-containing volume 352 substantially contains third aircraft component 350. Part-containing volume 352 extends from a reference locus 354 in a first direction 356 for a length $L_6$, extends in a second direction 358 substantially perpendicular with direction 356 for a depth $D_6$, and extends in a third direction 360 substantially perpendicular with directions 356 and 358 for a height $H_6$.

Figure 7:
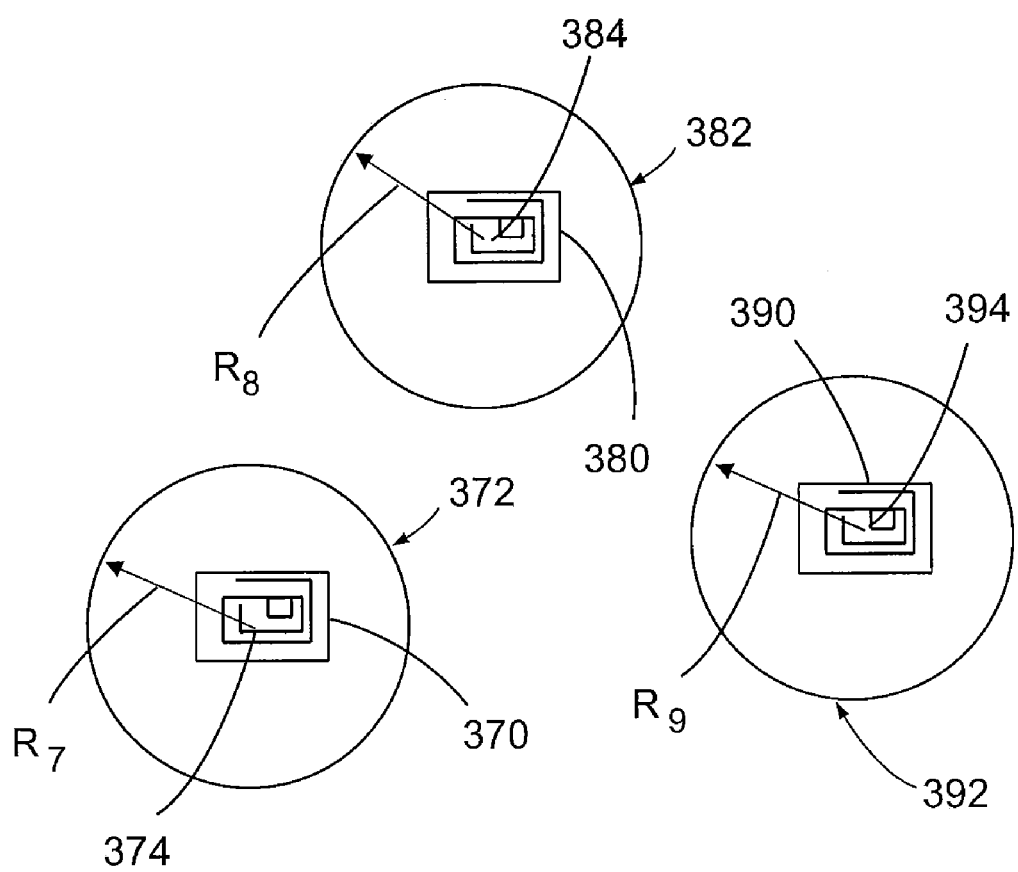
FIG. 7 presents perspective drawings of another example of individual parts having representative spherical part-containing volumes.

FIG. 7 presents perspective drawings of another example of individual parts having representative spherical part-containing volumes. In FIG. 7, a fourth aircraft component 370, for example, an antenna, is illustrated with an associated part-containing volume 372. Part-containing volume 372 substantially contains fourth aircraft component 370. Part-containing volume 372 is substantially spherical in shape, centered at a center locus 374 and having a radius $R_7$.

A fifth aircraft component 380, for example, a landing gear hydraulic component, is illustrated with an associated part-containing volume 382. Part-containing volume 382 substantially contains fifth aircraft component 380. Part-containing volume 382 is substantially spherical in shape, centered at a center locus 384 and having a radius $R_8$.

A sixth aircraft component 390, for example, an in-flight entertainment controller, is illustrated with an associated part-containing volume 392. Part-containing volume 392 substantially contains sixth aircraft component 390. Part-containing volume 392 is substantially spherical in shape, centered at a center locus 394 and having a radius $R_9$.

Figure 8:
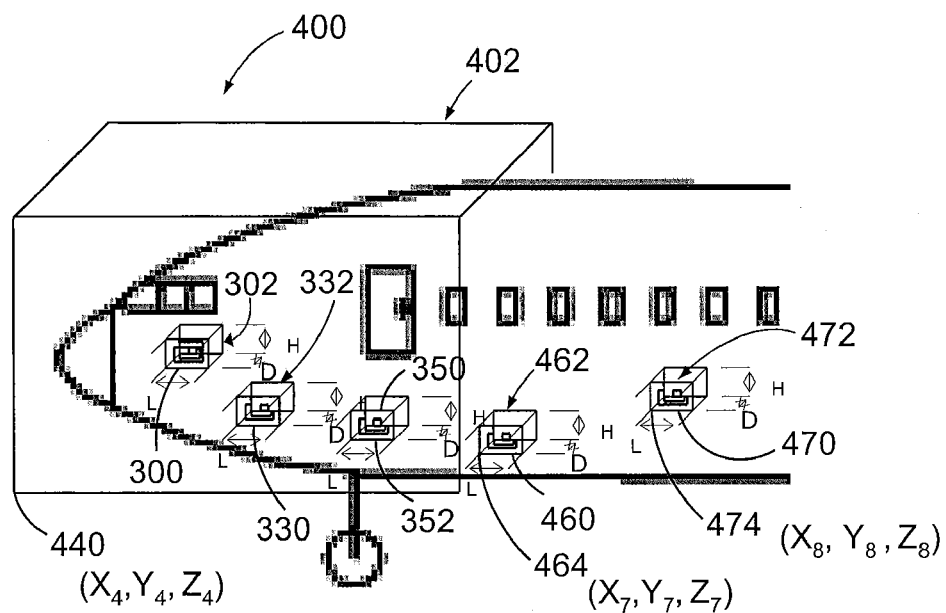
FIG. 8 illustrates a representative assembly including a polyhedral target volume containing the exemplary parts illustrated in FIG. 6 and associated proximate additional parts.
Figure 8:
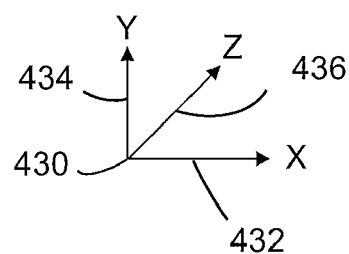

FIG. 8 illustrates a representative assembly including a polyhedral target volume containing the exemplary parts illustrated in FIG. 6 and associated proximate additional parts. In FIG. 8, a forward portion 400 of an aircraft includes first aircraft component 300, second aircraft component 330, and third aircraft component 350. First aircraft component 300 is contained in a part-containing volume 302 substantially containing first aircraft component 300. Second aircraft component 330 is contained in a part-containing volume 332 substantially containing second aircraft component 330. Third aircraft component 350 is contained in a part-containing volume 352 substantially containing third aircraft component 350.

Forward portion 400 is defined by a target volume 402. Target volume 402 substantially contains part-containing volumes 302, 332, 352. Target volume 402 is located with respect to an origin 430 and three axes; X-axis 432, Y-axis, 434 and Z-axis 436. Axes 432, 434, 436 are substantially orthogonal and intersect substantially at origin 430. Target volume 402 has a reference locus 440 located substantially at a point defined by measurements along axes 432, 434, 436: $(X_4, Y_4, Z_4)$.

A seventh aircraft component 460 substantially contained within a part-containing volume 462 is situated near or proximate to target volume 402. Part-containing volume 462 has a reference locus 464 located substantially at a point defined by measurements along axes 432, 434, 436: $(X_7, Y_7, Z_7)$. An eighth aircraft component 470 substantially contained within a part-containing volume 472 is also situated near or proximate to target volume 402. Part-containing volume 472 has a reference locus 474 located substantially at a point defined by measurements along axes 432, 434, 436: $(X_8, Y_8, Z_8)$.

In one embodiment a target volume 402 is ascertained. If either of part-containing volumes 462 and 472 has a predetermined relationship with target volume 402, the respective related part 460 and 470 is designated as a relevant part and is identified by the systems described herein as part of a solution group for a user. By way of example and not by way of limitation, the solution group may be sought by a user for use in a repair manual or in a service bulletin. By way of example and not by way of limitation, a predetermined relationship may be that one or both of part-containing volumes 462 and 472 abuts or intersects target volume 402.

Figure 9:
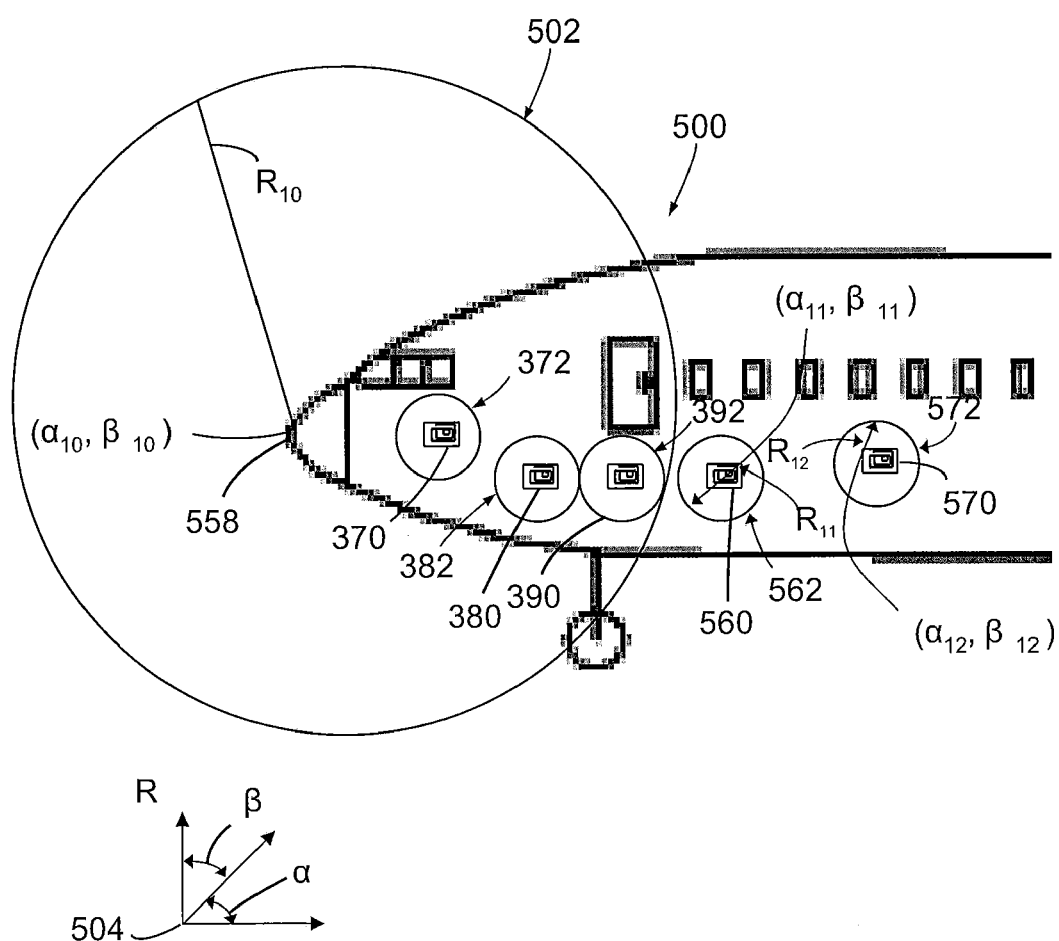
FIG. 9 illustrates a representative assembly including a polyhedral target volume containing the exemplary parts illustrated in FIG. 7 and associated proximate additional parts.

FIG. 9 illustrates a representative assembly including a polyhedral target volume containing the exemplary parts illustrated in FIG. 7 and associated proximate additional parts. In FIG. 9, a forward portion 500 of an aircraft includes a fourth aircraft component 370, a fifth aircraft component 380 and a sixth aircraft component 390. Fourth aircraft component 370 is contained in a part-containing volume 372 substantially containing fourth aircraft component 370. Fifth aircraft component 380 is contained in a part-containing volume 382 substantially containing fifth aircraft component 380. Sixth aircraft component 390 is contained in a part-containing volume 392 substantially containing sixth aircraft component 390.

Forward portion 500 is defined by a target volume 502. Target volume 502 substantially contains part-containing volumes 372, 382, 392. Target volume 502 is located with respect to an origin 504 and spherical coordinates: an angle $\alpha$ measured in a first plane, an angle $\beta$ measured in a second plane substantially perpendicular with the first plane and a radius R (distance from origin 504). Target volume 502 has a center locus located substantially at a point defined by coordinates $(\alpha_{10}, \beta_{10})$ and has a radius $R_{10}$. In one exemplary embodiment, the center locus is selected to be a tip of an aircraft nose 558.

A ninth aircraft component 560 substantially contained within a part-containing volume 562 is situated near or proximate to target volume 502. Part-containing volume 562 has a center locus located substantially at a point defined by coordinates $(\alpha_{11}, \beta_{11})$ and has a radius $R_{11}$. A tenth aircraft component 570 substantially contained within a part-containing volume 572 is also situated near or proximate to target volume 502. Part-containing volume 472 has a center locus located substantially at a point defined by coordinates $(\alpha_{12}, \beta_{12})$ and has a radius $R_{12}$.

In another embodiment, a target volume 502 is ascertained. If either of part-containing volumes 562, 572 has a predetermined relationship with target volume 502, the respective related part 560, 570 is designated as a relevant part and is identified by systems described herein as part of a solution group for a user. By way of example and not by way of limitation, the solution group may be sought by a user for use in a repair manual or in a service bulletin. By way of example and not by way of limitation, a predetermined relationship may be that one or both of part-containing volumes 562, 572 abuts or intersects target volume 502.

Figure 10:
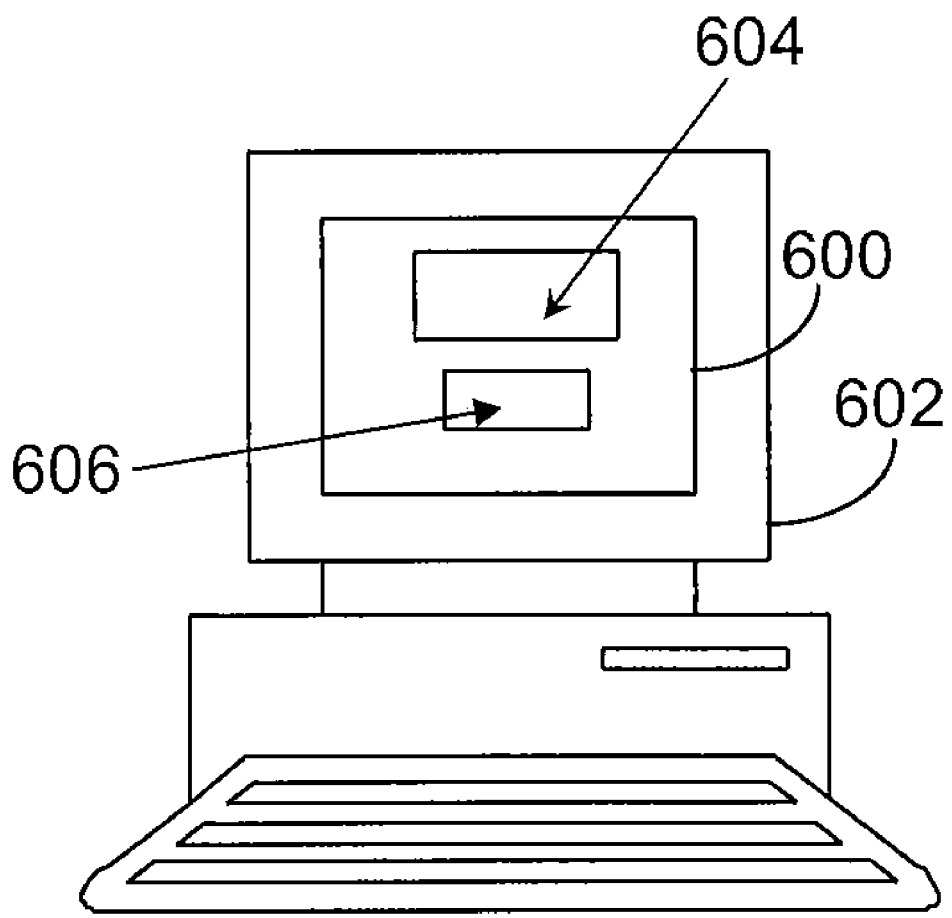
FIG. 10 is a representative display that may be produced by the apparatus of FIG. 5.

FIG. 10 is a representative display 600 on a user interface 602 that may be produced by the apparatus 200 of FIG. 5. In the exemplary embodiment, output unit 208 (shown in FIG. 5) presents display 600, which includes the solution group, to a user. Display 600 presents the solution group to a user via user interface 602, for example, and not limited to, a television screen, a liquid crystal display, and a computer monitor.

In one embodiment, the solution group shown on display 600 includes a diagram 604 of volume 302 and the parts contained within volume 302. Display 600 may also include a parts list 606, which may include information related to each of the parts contained within volume 302. Parts list 606 may be linked to a manufacturing or repair process and/or a repair manual or service bulletin.

Methods and systems for determining a solution group of parts in an assembly that permits a user to effect identifying parts having a predetermined relationship with a target volume substantially containing a target part or a target group of parts is described herein. The above-described embodiments of methods and systems for identifying a solution group of components from a plurality of components included in an assembly provide efficient and reliable means for identifying components positioned within a portion of the assembly that are of interest. More specifically, the above-described methods and systems allow a user to view a portion of an assembly, and the components included in that portion of the assembly, without viewing the entire assembly and the entirety of the components included in that assembly.

It would be useful to locate a component or group of components near to or adjacent to an identified component or group of components in order to verify, produce, amend or otherwise treat a repair manual or a service bulletin. Using the known processes for searching among products of an assembly may be awkward, inefficient, and disruptive to manufacturing or other applications using the on-line parts inventory system and apparatus.

It would be advantageous if a user could access an on-line parts inventory system for the purpose of identifying a solution group of parts with respect to an identified target volume containing a part or a group of parts. The solution group may be comprised of relevant parts having a predetermined relationship with respect to the target volume. A method and system providing such a capability for a user avoids having to load an entire parts inventory and use information relating to a process flow and layout of a finished assembly.

By way of example and not by way of limitation, an on-line parts system defining a part-containing volume for substantially all parts in the on-line system with respect to an origin permits a user to identify a target volume containing at least one target part and identify parts in the on-line parts system having a part-containing volume with a predetermined relationship with the target volume as relevant parts. Such an identification process may be carried out without loading the entire parts inventory for searching. The relevant parts may be included in the desired solution group for use, by way of example and not by way of limitation, in producing a service bulletin relating to parts contained within the target volume. Examples of a useful predetermined relationship between a part-containing volume and the target volume may include, by way of example and not by way of limitation, an abutting relationship between the two volumes or an overlapping relationship between the two volumes.

While the invention has been described in terms of various specific embodiments, those skilled in the art will recognize that the invention can be practiced with modification within the spirit and scope of the claims.

What is claimed is:

1. A method of forming an assembly from a plurality of components, the plurality of components each having a component volume and a respective reference locus point, said method comprising:

selecting at least a portion of a structure by defining a target volume and a respective reference locus point using a user interface;

determining a solution group of components comprising a list of components having a component volume positioned at least one of:

within the selected portion; and within a predetermined distance from the selected portion; and displaying at least one of a diagram of the selected structure portion and a listing of components within the selected structure portion forming the assembly.

2. A method according to claim 1 wherein selecting a portion of a structure comprises selecting a portion of an aircraft using the user interface.

3. A method according to claim 2 wherein displaying at least one of a diagram of the selected structure portion and a listing of components within the selected structure portion comprises displaying at least one of a diagram of the selected aircraft portion and a listing of aircraft components within the selected aircraft portion.

4. A method according to claim 1 wherein defining a reference locus point comprises inputting three-dimensional Cartesian coordinates.

5. A method according to claim 1 wherein defining a target volume and respective reference locus point comprises defining a length from the locus point, a depth from the locus point, and a height from the locus point.

6. A method according to claim 1 wherein defining a reference locus point comprises inputting spherical coordinates.

7. A method according to claim 1 wherein defining a target volume and respective reference locus point comprises defining an angle from a first plane, an angle from a second plane that is substantially perpendicular with the first plane, and a radial distance from the locus point.

8. A method according to claim 1 wherein displaying the solution group comprises displaying the solution group on a user interface.

9. A system for forming an assembly by identifying a solution group of components from a plurality of components, said system comprising:
    a storage unit configured to store data identifying a component volume and a related reference locus point for each of the plurality of components;
    an input unit that facilitates the selection of a target volume relating to at least portion of a structure, the target volume defined by a reference locus point and a volume;
    a computing unit communicatively coupled to said storage unit and said input unit, said computing unit configured to identify a solution group of components, the solution group of components comprising components of the structure having a component volume positioned at least one of within the target volume and a predetermined distance from the target volume; and
    an output unit communicatively coupled to said computing unit and configured to display the solution group.

10. A system according to claim 9 wherein the portion of a structure comprises a portion of an aircraft.

11. A system according to claim 9 wherein the components of the structure comprise at least one aircraft component.

12. A system according to claim 9 wherein said output unit is configured to display at least one of a diagram of said target volume and a list of components included in said solution group of components.

13. A method of identifying a component content of a relevant portion of an assembly, said method comprising:
    selecting, via a user interface, at least a portion of the assembly, the selected assembly portion representing the relevant portion of the assembly by defining a target volume and a respective reference locus point;
    determining the component content of the relevant portion of the assembly comprising a list of components having a component volume positioned at least one of within the target volume and a predetermined distance from the target volume; and
    displaying the component content of the relevant portion of the assembly, the component content including at least one of a diagram of the selected assembly portion and a listing of components within the selected assembly portion.

14. A method according to claim 13 wherein selecting at least a portion of the assembly comprises selecting a portion of an aircraft using the user interface.

15. A method according to claim 14 wherein a diagram of the selected assembly portion comprises a diagram of the selected aircraft portion and a listing of components within the selected assembly portion comprises a listing of aircraft components within the selected aircraft portion.

16. A method according to claim 13 wherein defining a reference locus point comprises inputting three-dimensional Cartesian coordinates.

17. A method according to claim 13 wherein defining a target volume and respective reference locus point comprises defining a length from the locus point, a depth from the locus point, and a height from the locus point.

18. A method according to claim 13 wherein defining a reference locus point comprises inputting spherical coordinates.

19. A method according to claim 13 wherein defining a target volume and respective reference locus point comprises defining an angle from a first plane, an angle from a second plane that is substantially perpendicular with the first plane, and a radial distance from the locus point.

20. A method according to claim 13 wherein displaying the component content comprises displaying the component content on a user interface.

* * * * *